US012573813B2

(12) United States Patent
Sugiyama et al.

(10) Patent No.: US 12,573,813 B2
(45) Date of Patent: Mar. 10, 2026

(54) QUANTUM CASCADE LASER ELEMENT, QUANTUM CASCADE LASER DEVICE, AND METHOD FOR MANUFACTURING QUANTUM CASCADE LASER DEVICE

(71) Applicant: HAMAMATSU PHOTONICS K.K., Hamamatsu (JP)

(72) Inventors: Atsushi Sugiyama, Hamamatsu (JP); Kousuke Shibata, Hamamatsu (JP); Kazuue Fujita, Hamamatsu (JP); Masahiro Hitaka, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 707 days.

(21) Appl. No.: 17/914,819

(22) PCT Filed: Mar. 25, 2021

(86) PCT No.: PCT/JP2021/012566
§ 371 (c)(1),
(2) Date: Sep. 27, 2022

(87) PCT Pub. No.: WO2021/200550
PCT Pub. Date: Oct. 7, 2021

(65) Prior Publication Data
US 2023/0133283 A1 May 4, 2023

(30) Foreign Application Priority Data
Apr. 2, 2020 (JP) .................................. 2020-066834

(51) Int. Cl.
*H01S 5/028* (2006.01)
*H01S 5/042* (2006.01)
(Continued)

(52) U.S. Cl.
CPC .......... *H01S 5/028* (2013.01); *H01S 5/04256* (2019.08); *H01S 5/0428* (2013.01); *H01S 5/22* (2013.01); *H01S 5/3402* (2013.01)

(58) Field of Classification Search
CPC ...... H01S 5/0287; H01S 5/3401; H01S 5/028; H01S 5/3402
See application file for complete search history.

(56) References Cited

U.S. PATENT DOCUMENTS 8,699,538 B2 * 4/2014 Edamura ............... H01S 5/0287
372/45.01
2008/0075133 A1 * 3/2008 Day ......................... H01S 5/14
372/36
(Continued)

FOREIGN PATENT DOCUMENTS

JP S60-113983 A 6/1985
JP 04299591 A * 10/1992 ............... H01S 3/18
(Continued)

OTHER PUBLICATIONS

Primary_English, handa translation (Year: 1992).*
International Preliminary Report on Patentability mailed Oct. 13, 2022 for PCT/JP2021/012566.

*Primary Examiner* — Minsun O Harvey
*Assistant Examiner* — Alexander Ehrlich
(74) *Attorney, Agent, or Firm* — Faegre Drinker Biddle & Reath LLP

(57) ABSTRACT

A quantum cascade laser element includes: a semiconductor substrate; a semiconductor laminate having a first end surface and a second end surface; a first electrode; a second electrode; and an anti-reflection film formed on the first end surface. The semiconductor laminate is configured to oscillate laser light having a center wavelength of 7.5 μm or more. The anti-reflection film includes an insulating film being a $CeO_2$ film formed on the first end surface, a first refractive index film being a $YF_3$ film or a $CeF_3$ film disposed on a side opposite the first end surface with respect to the insulating film, and a second refractive index film formed on the first refractive index film on a side opposite the first end surface with respect to the first refractive index film and having a refractive index of larger than 1.8.

14 Claims, 10 Drawing Sheets

(51) Int. Cl.
    *H01S 5/22*       (2006.01)
    *H01S 5/34*       (2006.01)

(56)             References Cited

U.S. PATENT DOCUMENTS

| | | | |
|---|---|---|---|
| 2010/0046568 A1* | 2/2010 | Maulini | G02B 1/115 |
| | | | 372/49.01 |
| 2013/0322480 A1* | 12/2013 | Edamura | H01S 5/12 |
| | | | 372/45.01 |
| 2015/0070698 A1* | 3/2015 | Muraviev | H01S 3/1392 |
| | | | 356/451 |
| 2018/0375294 A1* | 12/2018 | Hashimoto | H01S 5/0203 |
| 2020/0328575 A1* | 10/2020 | Nakamura | H01S 5/4031 |

FOREIGN PATENT DOCUMENTS

| | | |
|---|---|---|
| JP | H04-299591 A | 10/1992 |
| JP | H07-007225 A | 1/1995 |
| JP | H07-312460 A | 11/1995 |
| JP | 2004-031393 A | 1/2004 |
| JP | 2013-254764 A | 12/2013 |
| JP | 2015-088517 A | 5/2015 |
| KR | 10-2014-0127034 A | 11/2014 |
| WO | WO-2012/073791 A1 | 6/2012 |

* cited by examiner

*Fig.5*

| | MATERIAL | REFRACTIVE INDEX | FILM THICKNESS (nm) | | |
|---|---|---|---|---|---|
| | | | WAVELENGTH 10μm | WAVELENGTH 11μm | WAVELENGTH 12μm |
| INSULATING FILM | CeO₂ | 1.7 | 50 | 50 | 50 |
| INTERMEDIATE FILM | ZnS | 2.2 | 50 | 50 | 50 |
| FIRST REFRACTIVE INDEX FILM | YF₃ | 1.4 | 540 | 600 | 650 |
| SECOND REFRACTIVE INDEX FILM | ZnS | 2.2 | 500 | 550 | 600 |

| | MATERIAL | REFRACTIVE INDEX | FILM THICKNESS (nm) | | |
| --- | --- | --- | --- | --- | --- |
| | | | WAVELENGTH 10μm | WAVELENGTH 11μm | WAVELENGTH 12μm |
| INSULATING FILM | $CeO_2$ | 1.7 | 50 | 50 | 50 |
| INTERMEDIATE FILM | ZnS | 2.2 | 50 | 50 | 50 |
| FIRST REFRACTIVE INDEX FILM | $CeF_3$ | 1.45 | 600 | 650 | 670 |
| SECOND REFRACTIVE INDEX FILM | ZnS | 2.2 | 450 | 500 | 590 |

*Fig.9*

| | MATERIAL | REFRACTIVE INDEX | FILM THICKNESS (nm) | | |
| --- | --- | --- | --- | --- | --- |
| | | | WAVELENGTH 10μm | WAVELENGTH 11μm | WAVELENGTH 12μm |
| INSULATING FILM | CeO$_2$ | 1.7 | 50 | 50 | 50 |
| FIRST REFRACTIVE INDEX FILM | CeF$_3$ | 1.45 | 650 | 700 | 750 |
| SECOND REFRACTIVE INDEX FILM | ZnS | 2.2 | 450 | 500 | 550 |

QUANTUM CASCADE LASER ELEMENT, QUANTUM CASCADE LASER DEVICE, AND METHOD FOR MANUFACTURING QUANTUM CASCADE LASER DEVICE

TECHNICAL FIELD

The present disclosure relates a quantum cascade laser element, a quantum cascade laser device, and a method for manufacturing a quantum cascade laser device.

BACKGROUND ART

In the related art, a quantum cascade laser element has been known which includes a semiconductor substrate; a semiconductor laminate formed on the semiconductor substrate; a first electrode formed on a surface on an opposite side of the semiconductor laminate from the semiconductor substrate; and a second electrode formed on a surface on an opposite side of the semiconductor substrate from the semiconductor laminate, in which an anti-reflection film is formed on one end surface of a pair of end surfaces included in the semiconductor laminate including an active layer (for example, refer to Patent Literature 1).

CITATION LIST

Patent Literature

Patent Literature 1: Japanese Unexamined Patent Publication No. 2013-254764

SUMMARY OF INVENTION

Technical Problem

In recent years, there has been an increasing demand for a quantum cascade laser element capable of oscillating laser light having a center wavelength of 7.5 μm or more. For this reason, in the above-described quantum cascade laser element, it is desired that an anti-reflection film capable of reliably reducing the reflectance of laser light having a center wavelength of 7.5 μm or more and capable of securing sufficient durability is realized.

An object of the present disclosure is to provide a quantum cascade laser element including an anti-reflection film that effectively functions for laser light having a center wavelength of 7.5 μm or more, a quantum cascade laser device, and a method for manufacturing a quantum cascade laser device.

Solution to Problem

A quantum cascade laser element according to one aspect of the present disclosure includes: a semiconductor substrate; a semiconductor laminate formed on the semiconductor substrate to include an active layer having a quantum cascade structure and to have a first end surface and a second end surface facing each other in a light waveguide direction; a first electrode formed on a surface on an opposite side of the semiconductor laminate from the semiconductor substrate; a second electrode formed on a surface on an opposite side of the semiconductor substrate from the semiconductor laminate; and an anti-reflection film formed on the first end surface. The semiconductor laminate is configured to oscillate laser light having a center wavelength of 7.5 μm or more. The anti-reflection film includes an insulating film being a $CeO_2$ film formed on the first end surface, a first refractive index film being a $YF_3$ film or a $CeF_3$ film disposed on a side opposite the first end surface with respect to the insulating film, and a second refractive index film formed on the first refractive index film on a side opposite the first end surface with respect to the first refractive index film and having a refractive index of larger than 1.8.

In the quantum cascade laser element, the anti-reflection film includes the first refractive index film that is a $YF_3$ film or a $CeF_3$ film and the second refractive index film having a refractive index of larger than 1.8. Accordingly, the reflectance of laser light having a center wavelength of 7.5 μm or more can be reliably reduced. Further, the anti-reflection film includes the insulating film that is a $CeO_2$ film formed on the first end surface. Accordingly, it is possible to realize securing a property of transmitting laser light having a center wavelength of 7.5 μm or more, preventing a short circuit on the first end surface, and improving the adhesion of the anti-reflection film to the first end surface. Therefore, sufficient durability of the anti-reflection film can be secured. As described above, according to the quantum cascade laser element, the anti-reflection film that effectively functions for laser light having a center wavelength of 7.5 μm or more can be realized.

In the quantum cascade laser element according to one aspect of the present disclosure, the anti-reflection film may further include an intermediate film disposed between the insulating film and the first refractive index film, the intermediate film may be a ZnS film formed on the insulating film, the first refractive index film may be a $YF_3$ film formed on the intermediate film, and the second refractive index film may be a ZnS film. According to this aspect, adhesion between the films forming the anti-reflection film can be improved.

In the quantum cascade laser element according to one aspect of the present disclosure, the anti-reflection film may further include an intermediate film disposed between the insulating film and the first refractive index film, the intermediate film may be a ZnS film formed on the insulating film, the first refractive index film may be a $CeF_3$ film formed on the intermediate film, and the second refractive index film may be a ZnS film. According to this aspect, adhesion between the films forming the anti-reflection film can be improved.

In the quantum cascade laser element according to one aspect of the present disclosure, the first refractive index film may be a $CeF_3$ film formed on the insulating film, and the second refractive index film may be a ZnS film. According to this aspect, the configuration of the anti-reflection film can be simplified.

In the quantum cascade laser element according to one aspect of the present disclosure, a thickness of the insulating film may be 150 nm or less. According to this aspect, since the quality of the insulating film that is a $CeO_2$ film can be secured, as a result, the quality of each film forming the anti-reflection film can be secured.

A quantum cascade laser device according to one aspect of the present disclosure includes: the quantum cascade laser element; a support portion supporting the quantum cascade laser element; a joining member joining an electrode pad included in the support portion and the second electrode in a state where the semiconductor substrate is located on a support portion side with respect to the semiconductor laminate; a wire connected to the first electrode; and a drive unit electrically connected to each of the electrode pad and the wire, and configured to drive the quantum cascade laser element. The anti-reflection film is formed to reach at least one of the support portion and the wire from the first end surface.

In the quantum cascade laser device, the anti-reflection film is formed to reach at least one of the support portion and the wire from the first end surface. Accordingly, heat generated on the first end surface is easily released to at least one of the support portion and the wire that the anti-reflection film reaches, for example, as compared to a configuration in which the anti-reflection film reaches neither the support portion nor the wire. Therefore, according to the quantum cascade laser device, the anti-reflection film that effectively functions for laser light having a center wavelength of 7.5 μm or more can be realized.

A quantum cascade laser device according to one aspect of the present disclosure includes: the quantum cascade laser element; a support portion supporting the quantum cascade laser element; a joining member joining an electrode pad included in the support portion and the first electrode in a state where the semiconductor laminate is located on a support portion side with respect to the semiconductor substrate; a wire connected to the second electrode; and a drive unit electrically connected to each of the electrode pad and the wire, and configured to drive the quantum cascade laser element. The anti-reflection film is formed to reach at least one of the support portion and the wire from the first end surface.

In the quantum cascade laser device, the anti-reflection film is formed to reach at least one of the support portion and the wire from the first end surface. Accordingly, heat generated on the first end surface is easily released to at least one of the support portion and the wire that the anti-reflection film reaches, for example, as compared to a configuration in which the anti-reflection film reaches neither the support portion nor the wire. Therefore, according to the quantum cascade laser device, the anti-reflection film that effectively functions for laser light having a center wavelength of 7.5 μm or more can be realized.

In the quantum cascade laser device according to one aspect of the present disclosure, the drive unit may drive the quantum cascade laser element such that the quantum cascade laser element oscillates laser light in a pulsed manner. According to this aspect, laser light having a center wavelength of 7.5 μm or more can be oscillated through the anti-reflection film in a pulsed manner. In addition, heat generation on the first end surface can be suppressed, for example, as compared to a configuration in which the quantum cascade laser element continuously oscillates laser light. Therefore, the degradation of the anti-reflection film caused by heat generation on the first end surface can be suppressed.

A method for manufacturing the quantum cascade laser device according to one aspect of the present disclosure includes: a first step of preparing the quantum cascade laser element and the support portion including the electrode pad, of joining the electrode pad and the second electrode using the joining member in a state where the semiconductor substrate is located on the support portion side with respect to the semiconductor laminate, and of connecting the wire to the first electrode; and a second step of forming the anti-reflection film on the first end surface after the first step.

In the method for manufacturing the quantum cascade laser device, after the electrode pad of the support portion and the second electrode of the quantum cascade laser element are joined by the joining member, the anti-reflection film is formed on the first end surface of the quantum cascade laser element. Accordingly, a situation where heating applied when the electrode pad and the second electrode are joined causes the degradation of the anti-reflection film is avoided. Therefore, according to the method for manufacturing the quantum cascade laser device, the anti-reflection film that effectively functions for laser light having a center wavelength of 7.5 μm or more can be realized.

A method for manufacturing the quantum cascade laser device according to one aspect of the present disclosure includes: a first step of preparing the quantum cascade laser element and the support portion including the electrode pad, of joining the electrode pad and the first electrode using the joining member in a state where the semiconductor laminate is located on the support portion side with respect to the semiconductor substrate, and of connecting the wire to the second electrode; and a second step of forming the anti-reflection film on the first end surface after the first step.

In the method for manufacturing the quantum cascade laser device, after the electrode pad of the support portion and the first electrode of the quantum cascade laser element are joined by the joining member, the anti-reflection film is formed on the first end surface of the quantum cascade laser element. Accordingly, a situation where heating applied when the electrode pad and the first electrode are joined causes the degradation of the anti-reflection film is avoided. Therefore, according to the method for manufacturing the quantum cascade laser device, the anti-reflection film that effectively functions for laser light having a center wavelength of 7.5 μm or more can be realized.

In the method for manufacturing the quantum cascade laser device according to one aspect of the present disclosure, in the second step, the anti-reflection film may be formed to reach at least one of the support portion and the wire from the first end surface. According to this aspect, the quantum cascade laser device in which heat generated on the first end surface is easily released to at least one of the support portion and the wire that the anti-reflection film reaches can be easily and reliably obtained.

Advantageous Effects of Invention

According to the present disclosure, it is possible to provide the quantum cascade laser element including the anti-reflection film that effectively functions for laser light having a center wavelength of 7.5 μm or more, the quantum cascade laser device, and the method for manufacturing a quantum cascade laser device.

BRIEF DESCRIPTION OF DRAWINGS

FIG. 5 is a table showing one example of numerical values of each film forming the anti-reflection film shown in FIG. 4.

FIG. 7 is a table showing one example of numerical values of each film forming an anti-reflection film of a first modification example.

FIG. 9 is a table showing one example of numerical values of each film forming the anti-reflection film of the second modification example.

DESCRIPTION OF EMBODIMENTS

Figure 1:
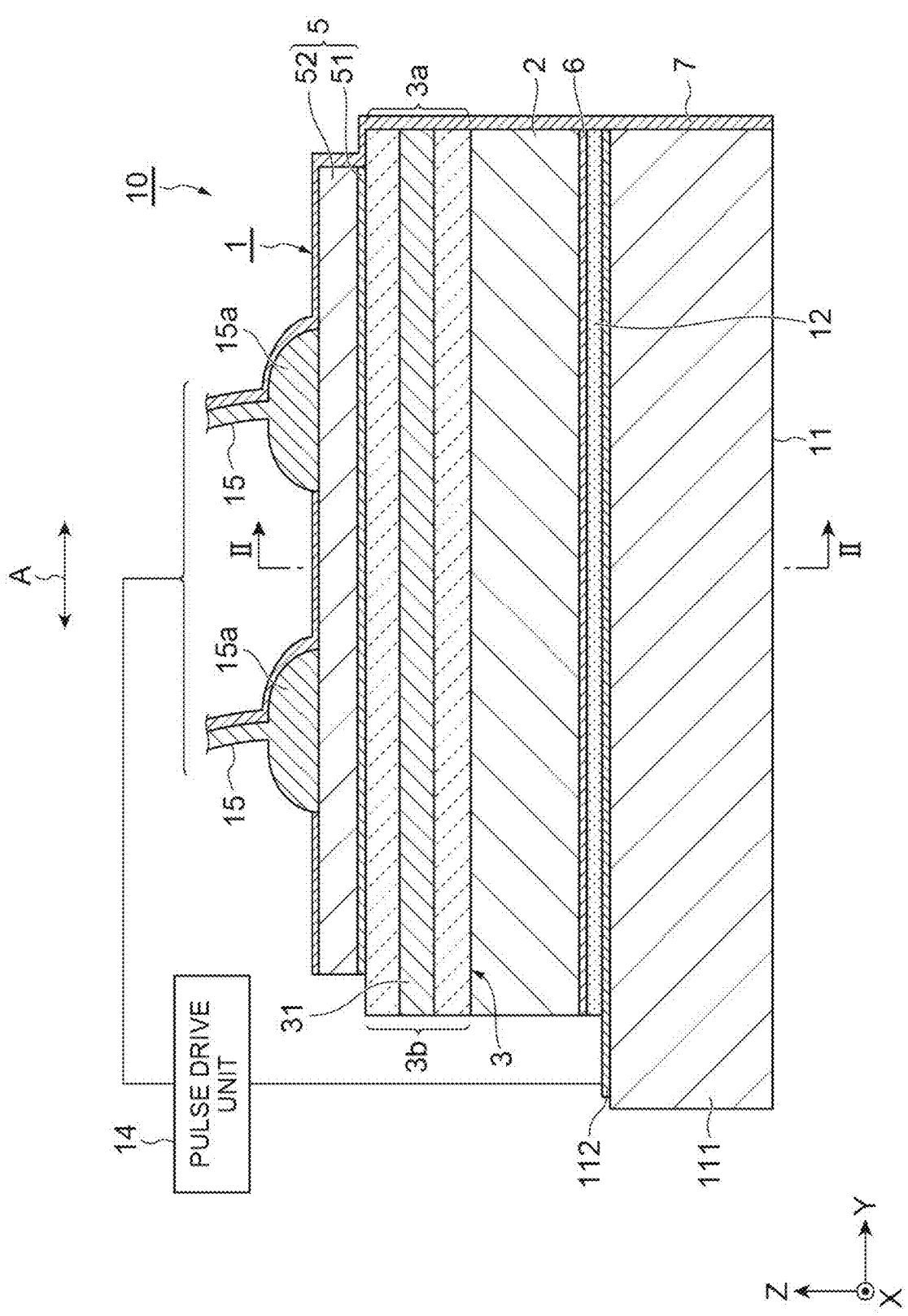
FIG. 1 a cross-sectional view of a quantum cascade laser device of one embodiment.

Hereinafter, embodiments of the present disclosure will be described in detail with reference to the drawings. Incidentally, in the drawings, the same or equivalent portions are denoted by the same reference signs, and a duplicated description will be omitted.

Configuration of Quantum Cascade Laser Device

Figure 2:
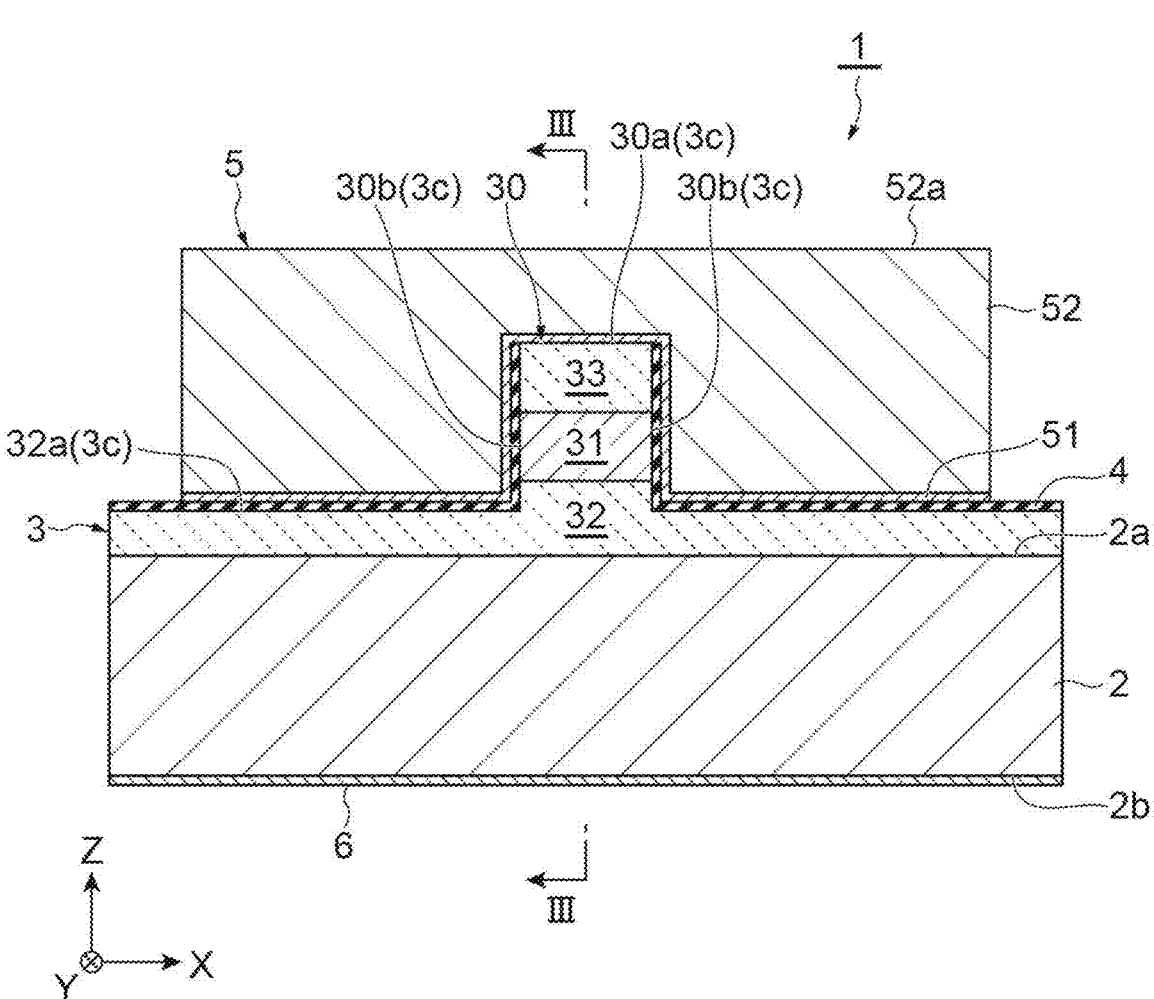
FIG. 2 is a cross-sectional view of a quantum cascade laser element taken along line II-II shown in FIG. 1.
Figure 3:
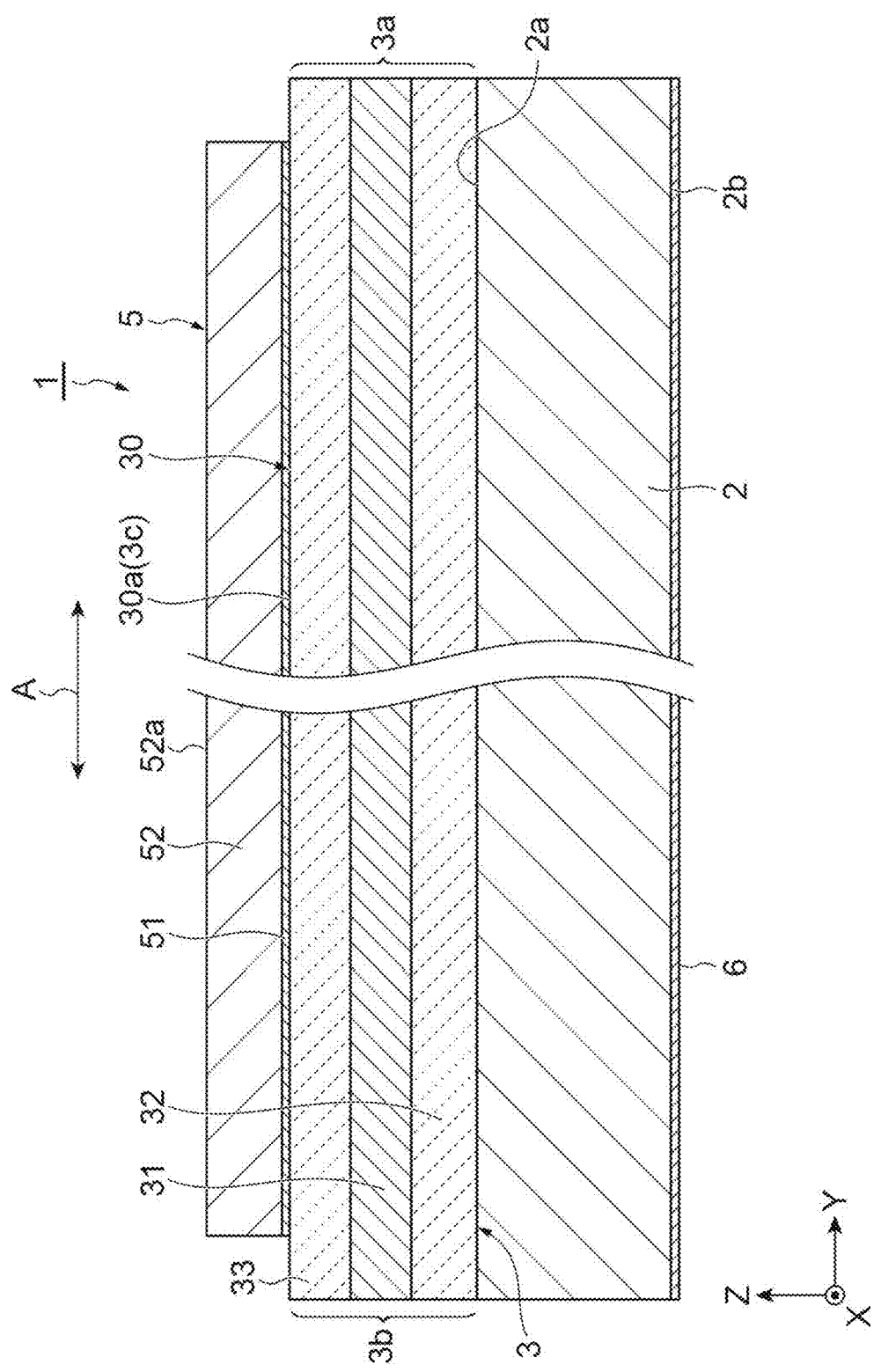
FIG. 3 is a cross-sectional view of the quantum cascade laser element taken along line III-III shown in FIG. 2.

As shown in FIG. 1, a quantum cascade laser device 10 includes a quantum cascade laser element 1. As shown in FIGS. 2 and 3, the quantum cascade laser element 1 includes a semiconductor substrate 2, a semiconductor laminate 3, an insulating film 4, a first electrode 5, and a second electrode 6. The semiconductor substrate 2 is, for example, an S-doped InP single crystal substrate having a rectangular plate shape. As one example, a length of the semiconductor substrate 2 is approximately 3 mm, a width of the semiconductor substrate 2 is approximately 500 μm, and a thickness of the semiconductor substrate 2 is approximately one hundred and several tens of μm. In the following description, a width direction of the semiconductor substrate 2 is referred to as an X-axis direction, a length direction of the semiconductor substrate 2 is referred to as a Y-axis direction, and a thickness direction of the semiconductor substrate 2 is referred to as a Z-axis direction.

The semiconductor laminate 3 is formed on a surface 2a of the semiconductor substrate 2. The semiconductor laminate 3 includes an active layer 31 having a quantum cascade structure. The semiconductor laminate 3 is configured to oscillate laser light having a center wavelength of 7.5 μm or more. As one example, the semiconductor laminate 3 is configured to oscillate laser light having a center wavelength of any value of 7.5 to 16 μm that is a wavelength in a mid-infrared region. In the present embodiment, the semiconductor laminate 3 is formed by stacking a lower cladding layer 32, a lower guide layer (not shown), the active layer 31, an upper guide layer (not shown), an upper cladding layer 33, and a contact layer (not shown) in order from a semiconductor substrate 2 side. The upper guide layer has a diffraction grating structure functioning as a distributed feedback (DFB) structure.

The active layer 31 is, for example, a layer having a multiple quantum well structure of InGaAs/InAlAs. Each of the lower cladding layer 32 and the upper cladding layer 33 is, for example, a Si-doped InP layer. Each of the lower guide layer and the upper guide layer is, for example, a Si-doped InGaAs layer. The contact layer is, for example, a Si-doped InGaAs layer.

The semiconductor laminate 3 includes a ridge portion 30 extending along the Y-axis direction. The ridge portion 30 is formed of a portion on an opposite side of the lower cladding layer 32 from the semiconductor substrate 2, the lower guide layer, the active layer 31, the upper guide layer, the upper cladding layer 33, and the contact layer. A width of the ridge portion 30 in the X-axis direction is smaller than a width of the semiconductor substrate 2 in the X-axis direction. A length of the ridge portion 30 in the Y-axis direction is equal to a length of the semiconductor substrate 2 in the Y-axis direction. As one example, the length of the ridge portion 30 is approximately 3 mm, the width of the ridge portion 30 is approximately several μm to ten and several μm, and a thickness of the ridge portion 30 is approximately several μm. The ridge portion 30 is located at the center of the semiconductor substrate 2 in the X-axis direction. Each layer forming the semiconductor laminate 3 does not exist on both sides of the ridge portion 30 in the X-axis direction.

The semiconductor laminate 3 has a first end surface 3a and a second end surface 3b facing each other in a light waveguide direction A of the ridge portion 30. The light waveguide direction A is a direction parallel to the Y-axis direction that is an extending direction of the ridge portion 30. The first end surface 3a and the second end surface 3b function as light-emitting end surfaces. The first end surface 3a and the second end surface 3b are located on the same planes as those of both respective side surfaces of the semiconductor substrate 2 in the Y-axis direction.

The insulating film 4 is formed on side surfaces 30b of the ridge portion 30 and on a surface 32a of the lower cladding layer 32 such that a surface 30a on an opposite side of the ridge portion 30 from the semiconductor substrate 2 is exposed. The side surfaces 30b of the ridge portion 30 are both side surfaces of the ridge portion 30 facing each other in the X-axis direction. The surface 32a of the lower cladding layer 32 is a surface of a portion on an opposite side of the lower cladding layer 32 from the semiconductor substrate 2, the portion not forming the ridge portion 30. The insulating film 4 is, for example, a SiN film or a SiO$_2$ film.

The first electrode 5 is formed on a surface 3c on an opposite side of the semiconductor laminate 3 from the semiconductor substrate 2. The surface 3c of the semiconductor laminate 3 is a surface formed of the surface 30a of the ridge portion 30, the side surfaces 30b of the ridge portion 30, and the surface 32a of the lower cladding layer 32. When viewed in the Z-axis direction, an outer edge of the first electrode 5 is located inside outer edges of the semiconductor substrate 2 and the semiconductor laminate 3. The first electrode 5 is in contact with the surface 30a of the ridge portion 30 on the surface 30a of the ridge portion 30 and is in contact with the insulating film 4 on the side surfaces 30b of the ridge portion 30 and on the surface 32a of the lower cladding layer 32. Accordingly, the first electrode 5 is electrically connected to the upper cladding layer 33 through the contact layer.

The first electrode 5 includes a metal foundation layer 51 and a metal plating layer 52. The metal foundation layer 51 is formed to extend along the surface 3c of the semiconductor laminate 3. The metal foundation layer 51 is, for example, a Ti/Au layer. The metal plating layer 52 is formed on the metal foundation layer 51 such that the ridge portion 30 is embedded in the metal plating layer 52. The metal plating layer 52 is, for example, an Au plating layer. A surface 52a on an opposite side of the metal plating layer 52 from the semiconductor substrate 2 is a flat surface perpendicular to the Z-axis direction. As one example, the surface 52a of the metal plating layer 52 is a polished surface that is flattened by chemical mechanical polishing, and polishing marks are formed on surface 52a of the metal plating layer 52. Incidentally, the fact that the ridge portion 30 is embedded in the metal plating layer 52 means that the ridge portion 30 is covered with the metal plating layer 52 in a state where a thickness of portions of the metal plating layer 52 (thickness of the portions in the Z-axis direction) is larger than the thickness of the ridge portion 30 in the Z-axis direction, the portions being located on both sides of the ridge portion 30 in the X-axis direction.

The second electrode 6 is formed on a surface 2b on an opposite side of the semiconductor substrate 2 from the semiconductor laminate 3. The second electrode 6 is, for example, an AuGe/Au film, an AuGe/Ni/Au film, or an Au film. The second electrode 6 is electrically connected to the lower cladding layer 32 through the semiconductor substrate 2.

As shown in FIG. 1, the quantum cascade laser device 10 further includes a support portion 11, a joining member 12, a plurality of wires 15, and a pulse drive unit (drive unit) 14.

The support portion 11 includes a body portion 111 and an electrode pad 112. The support portion 11 is, for example, a sub-mount in which the body portion 111 is made of AlN. The support portion 11 supports the quantum cascade laser element 1 in a state where the semiconductor substrate 2 is located on a support portion 11 side with respect to the semiconductor laminate 3 (namely, an epi-side-up state).

The joining member 12 joins the electrode pad 112 of the support portion 11 and the second electrode 6 of the quantum cascade laser element 1 in the epi-side-up state. The joining member 12 is, for example, a solder member such as an AuSn member. A thickness of a portion of the joining member 12 disposed between the electrode pad 112 and the second electrode 6 is, for example, approximately several μm.

The plurality of wires 15 are connected to the first electrode 5. Each of the wires 15 is formed by performing wire bonding on the first electrode 5 (more specifically, the surface 52a of the metal plating layer 52). At least one wire 15 may be connected to the first electrode 5.

The pulse drive unit 14 is electrically connected to the electrode pad 112 and to each of the wires 15. Namely, the pulse drive unit 14 is electrically connected to each of the first electrode 5 and the second electrode 6 of the quantum cascade laser element 1. The pulse drive unit 14 drives the quantum cascade laser element 1 such that the quantum cascade laser element 1 oscillates laser light in a pulsed manner. A pulse width of the laser light is, for example, 20 to 1000 ns, a repetition frequency of the laser light is, for example, 1 to 1000 kHz, and a duty is, for example, 10% or less.

The quantum cascade laser element 1 further includes an anti-reflection film 7. The anti-reflection film 7 is formed on the first end surface 3a. The anti-reflection film 7 has a function of suppressing the resonance of laser light on the first end surface 3a and a function of reducing the reflectance of laser light having a center wavelength of 7.5 μm or more when the laser light is emitted from the first end surface 3a. In the present embodiment, the anti-reflection film 7 is formed to reach both the support portion 11 and each of the wires 15 from the first end surface 3a. More specifically, the anti-reflection film 7 reaches a surface on a first end surface 3a side of the support portion 11 (namely, a surface on the first end surface 3a side of each of the electrode pad 112 and the body portion 111) from the first end surface 3a via a surface on the first end surface 3a side of each of the semiconductor substrate 2, the second electrode 6, and the joining member 12. In addition, the anti-reflection film 7 reaches a surface on the first end surface 3a side of a connection end portion 15a of each of the wires 15 from the first end surface 3a via a surface on the first end surface 3a side of the first electrode 5. Incidentally, in FIGS. 2 and 3, the illustration of the anti-reflection film 7 is omitted.

Figure 4:
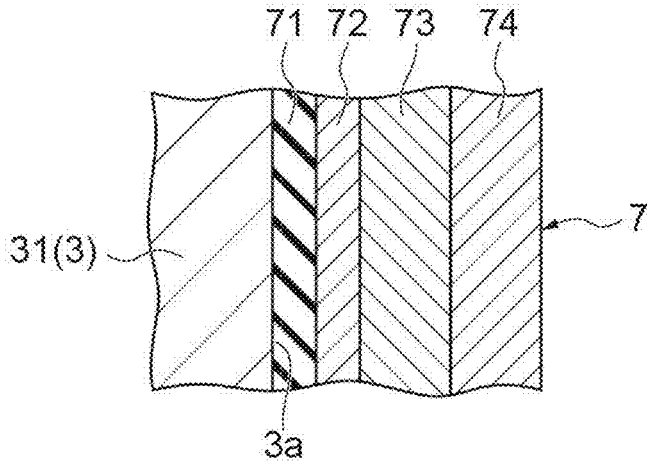
FIG. 4 is an enlarged cross-sectional view of an anti-reflection film shown in FIG. 1.

As shown in FIG. 4, the anti-reflection film 7 includes an insulating film 71, an intermediate film 72, a first refractive index film 73, and a second refractive index film 74. The insulating film 71 is a $CeO_2$ film formed on the first end surface 3a of the semiconductor laminate 3. The intermediate film 72 is a ZnS film formed on the insulating film 71 on a side opposite the first end surface 3a with respect to the insulating film 71. The first refractive index film 73 is a $YF_3$ film formed on the intermediate film 72 on a side opposite the first end surface 3a with respect to the intermediate film 72. The second refractive index film 74 is a ZnS film formed on the first refractive index film 73 on a side opposite the first end surface 3a with respect to the first refractive index film 73. The insulating film 71 is directly (namely, without another film or the like interposed therebetween) provided on the first end surface 3a. The intermediate film 72 is directly formed on the insulating film 71. The first refractive index film 73 is directly formed on the intermediate film 72. The second refractive index film 74 is directly formed on the first refractive index film 73.

FIG. 5 is a table showing one example of numerical values of each film forming the anti-reflection film 7 shown in FIG. 4. In FIG. 5, the "wavelengths" in the "film thickness" column indicate center wavelengths of laser light oscillated by the semiconductor laminate 3, and in the "film thickness" column, the thicknesses of each film that can reduce the reflectance of laser light of each "wavelength" to less than 0.1% are written. Here, the reason that the anti-reflection film 7 includes the first refractive index film 73 and the second refractive index film 74 will be described.

In an anti-reflection film including only one type of refractive index film, when a center wavelength of laser light is λ, a refractive index of the one type of refractive index film is n, and a thickness of the one type of refractive index film is t, if a relationship of t=λ/4n is satisfied, the anti-reflection film can reduce the reflectance of the laser light to less than 0.1%. Here, since n corresponds to a square root of a refractive index of the semiconductor laminate 3, when the refractive index of the semiconductor laminate 3 is 3.2, $n=(3.2)^{1/2}\approx1.8$. However, a material having a property of sufficiently transmitting light having a wavelength of 7.5 μm or more and having a refractive index of 1.8 does not exist. Therefore, in the anti-reflection film 7, a low reflectance is realized by the first refractive index film 73 having a refractive index of smaller than 1.8 and the second refractive index film 74 having a refractive index of larger than 1.8.

Incidentally, the insulating film 71 may have a thickness that can realize securing a property of transmitting laser light having a center wavelength of 7.5 μm or more, preventing a short circuit on the first end surface 3a, and improving the adhesion of the anti-reflection film 7 to the first end surface 3a. In the present embodiment, from the viewpoint of securing the quality of the insulating film 71, a thickness of the insulating film 71 is set to 150 nm or less. In addition, the intermediate film 72 may have a thickness that can realize improving adhesion between the insulating film 71 and the first refractive index film 73.

In the quantum cascade laser device 10 configured as described above, when the pulse drive unit 14 applies a bias voltage to the active layer 31 of the quantum cascade laser element 1, light is emitted from the active layer 31, and laser light having a center wavelength of 7.5 μm or more of the light is oscillated in a distributed feedback structure. At this time, the anti-reflection film 7 having a function of reducing the reflectance of the laser light having a center wavelength of 7.5 μm or more is formed on the first end surface 3a. Accordingly, the laser light having a center wavelength of 7.5 μm or more is oscillated from the first end surface 3a through the anti-reflection film 7 in a pulsed manner.

Method for Manufacturing Quantum Cascade Laser Device

A method for manufacturing the quantum cascade laser device 10 described above will be described. First, as shown in (a) of FIG. 6, the quantum cascade laser element 1 and the support portion 11 are prepared. Subsequently, in the epi-side-up state, the electrode pad 112 of the support portion 11 and the second electrode 6 of the quantum cascade laser element 1 are joined by the joining member 12, and the plurality of wires 15 are connected to the first electrode 5 of the quantum cascade laser element 1 (first step).

Figure 6:
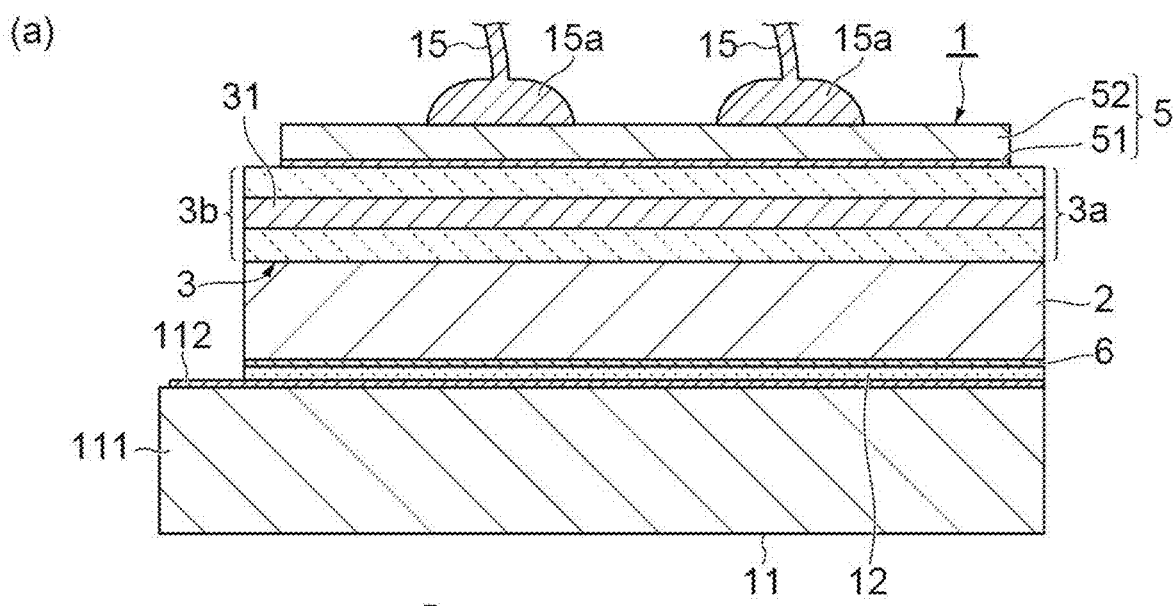
FIG. 6 is a view showing a method for manufacturing the quantum cascade laser device shown in FIG. 1.

Subsequently, as shown in (b) of FIG. 6, the anti-reflection film 7 is formed on the first end surface 3*a* of the quantum cascade laser element 1 (second step). At this time, the anti-reflection film 7 is formed to reach both the support portion 11 and each of the wires 15 from the first end surface 3*a*. In the present embodiment, the anti-reflection film 7 is formed by forming each film by evaporation in order of the insulating film 71, the intermediate film 72, the first refractive index film 73, and the second refractive index film 74. Subsequently, as shown in FIG. 1, the pulse drive unit 14 is electrically connected to the electrode pad 112 and to each of the wires 15 to obtain the quantum cascade laser device 10.

Incidentally, as one example, the quantum cascade laser element 1 is manufactured as follows. First, a semiconductor layer including a plurality of portions each of which becomes the semiconductor laminate 3 is formed on a surface of a semiconductor wafer including a plurality of portions each of which becomes the semiconductor substrate 2. Subsequently, a part of the semiconductor layer is removed by etching such that the portions of the semiconductor layer each of which becomes the semiconductor laminate 3 includes the ridge portions 30. Subsequently, an insulating layer including a plurality of portions each of which becomes the insulating film 4 is formed on the semiconductor layer such that the surface 30*a* of each of the ridge portions 30 is exposed. Subsequently, a metal foundation layer including a plurality of portions each of which becomes the metal foundation layer 51 is formed to cover the surface 30*a* of each of the ridge portions 30 and to cover the insulating layer. Subsequently, a plurality of metal plating layers each of which becomes the metal plating layer 52 is formed on the metal foundation layer, and the ridge portion 30 is embedded in each of the metal plating layers. Subsequently, a surface of each of the metal plating layers is flattened by polishing. Subsequently, the semiconductor wafer is thinned by polishing a back surface of the semiconductor wafer, and an electrode layer including a plurality of portions each of which becomes the second electrode 6 is formed on the back surface of the semiconductor wafer. Subsequently, a plurality of the quantum cascade laser elements 1 are obtained by cleaving the semiconductor wafer.

Actions and Effects

In the quantum cascade laser element 1, the anti-reflection film 7 includes the first refractive index film 73 that is a $YF_3$ film as a refractive index film having a refractive index of smaller than 1.8, and the second refractive index film 74 that is a ZnS film as a refractive index film having a refractive index of larger than 1.8. Accordingly, the reflectance of laser light having a center wavelength of 7.5 $\mu$m or more can be reliably reduced. Further, the anti-reflection film 7 includes the insulating film 71 that is a $CeO_2$ film formed on the first end surface 3*a*. Accordingly, it is possible to realize securing a property of transmitting laser light having a center wavelength of 7.5 $\mu$m or more, preventing a short circuit on the first end surface 3*a*, and improving the adhesion of the anti-reflection film 7 to the first end surface 3*a*. Therefore, sufficient durability of the anti-reflection film 7 can be secured. As described above, according to the quantum cascade laser element 1, the anti-reflection film 7 that effectively functions for laser light having a center wavelength of 7.5 $\mu$m or more can be realized.

Incidentally, for example, $BaF_2$, $MgF_2$, $CaF_2$, and the like exist as a material having a refractive index of smaller than 1.8. However, since the roughness of a surface of a film is large when the film is made of $BaF_2$, $BaF_2$ is not suitable as a material for the first refractive index film 73. In addition, since $MgF_2$ and $CaF_2$ absorb light having a wavelength of 10 $\mu$m or more, $MgF_2$ and $CaF_2$ are not suitable as a material for the first refractive index film 73.

In the quantum cascade laser element 1, the intermediate film 72 is a ZnS film formed on the insulating film 71, the first refractive index film 73 is a $YF_3$ film formed on the intermediate film 72, and the second refractive index film 74 is a ZnS film formed on the first refractive index film 73. Accordingly adhesion between the films forming the anti-reflection film 7 can be improved.

In the quantum cascade laser element 1, the thickness of the insulating film 71 is 150 nm or less. Accordingly, since the quality of the insulating film 71 that is a $CeO_2$ film can be secured, as a result, the quality of each film forming the anti-reflection film 7 can be secured. Incidentally, when the insulating film 71 is formed by evaporation, the quality of the insulating film 71 degrades if the thickness of the insulating film 71 is more than 150 nm.

In the quantum cascade laser device 10, the anti-reflection film 7 is formed to reach both the support portion 11 and each of the wires 15 from the first end surface 3*a* of the quantum cascade laser element 1. Accordingly, heat generated on the first end surface 3*a* is easily released to both the support portion 11 and each of the wires 15, for example, as compared to a configuration in which the anti-reflection film 7 reaches neither the support portion 11 nor each of the wires 15. Therefore, according to the quantum cascade laser device 10, the anti-reflection film 7 that effectively functions for laser light having a center wavelength of 7.5 $\mu$m or more can be realized.

In the quantum cascade laser device 10, the pulse drive unit 14 drives the quantum cascade laser element 1 such that the quantum cascade laser element 1 oscillates laser light in a pulsed manner. Accordingly, laser light having a center wavelength of 7.5 $\mu$m or more can be oscillated through the anti-reflection film 7 in a pulsed manner. In addition, heat generation on the first end surface 3*a* can be suppressed, for example, as compared to a configuration in which the quantum cascade laser element 1 continuously oscillates laser light. Therefore, the degradation of the anti-reflection film 7 caused by heat generation on the first end surface 3*a* can be suppressed.

In the method for manufacturing the quantum cascade laser device 10, after the electrode pad 112 of the support portion 11 and the second electrode 6 of the quantum cascade laser element 1 are joined by the joining member 12, the anti-reflection film 7 is formed on the first end surface 3*a* of the quantum cascade laser element 1. Accordingly, a situation where heating applied when the electrode pad 112 and the second electrode 6 are joined causes the degradation of the anti-reflection film 7 is avoided. Therefore, according to the method for manufacturing the quantum cascade laser device 10, the anti-reflection film 7 that effectively functions for laser light having a center wavelength of 7.5 μm or more can be realized.

In the method for manufacturing the quantum cascade laser device 10, the anti-reflection film 7 is formed to reach both the support portion 11 and each of the wires 15 from the first end surface 3a of the quantum cascade laser element 1. Accordingly, the quantum cascade laser device 10 in which heat generated on the first end surface 3a is easily released to both the support portion 11 and each of the wires 15 can be easily and reliably obtained.

Modification Examples

The present disclosure is not limited to the above-described embodiment. For example, a known quantum cascade structure can be applied to the active layer 31. In addition, a known stack structure can be applied to the semiconductor laminate 3. As one example, in the semiconductor laminate 3, the upper guide layer may not have a diffraction grating structure functioning as a distributed feedback structure.

In addition, when viewed in the Z-axis direction, an outer edge of the metal foundation layer 51 of the first electrode 5 may coincide with the outer edges of the semiconductor substrate 2 and the semiconductor laminate 3. Incidentally, when the outer edge of the metal foundation layer 51 of the first electrode 5 coincides with at least the first end surface 3a and the second end surface 3b when viewed in the Z-axis direction, heat dissipation on the first end surface 3a and on the second end surface 3b can be secured.

In addition, in the first electrode 5, the metal plating layer 52 may not be flattened by polishing. In addition, the first electrode 5 may not include the metal plating layer 52 and may be, for example, a metal film formed to extend along the surface 3c of the semiconductor laminate 3.

In addition, in the anti-reflection film 7 shown in FIGS. 4 and 5, the first refractive index film 73 may be a $CeF_3$ film instead of a $YF_3$ film (hereinafter, referred to as the "anti-reflection film 7 of a first modification example"). Even in the anti-reflection film 7 of the first modification example, for the same reason as when the first refractive index film 73 is a $YF_3$ film, the anti-reflection film 7 that effectively functions for laser light having a center wavelength of 7.5 μm or more can be realized. In addition, adhesion between the films forming the anti-reflection film 7 can be improved. FIG. 7 is a table showing one example of numerical values of each film forming the anti-reflection film 7 of the first modification example. In FIG. 7, the "wavelengths" in the "film thickness" column indicate center wavelengths of laser light oscillated by the semiconductor laminate 3, and in the "film thickness" column, the thicknesses of each film that can reduce the reflectance of laser light of each "wavelength" to less than 0.1% are written.

In addition, the anti-reflection film 7 shown in FIGS. 4 and 5 includes the intermediate film 72 disposed between the insulating film 71 and the first refractive index film 73, but the anti-reflection film 7 may not include the intermediate film 72. Namely, the first refractive index film 73 may be disposed on the side opposite the first end surface 3a with respect to the insulating film 71.

Figure 8:
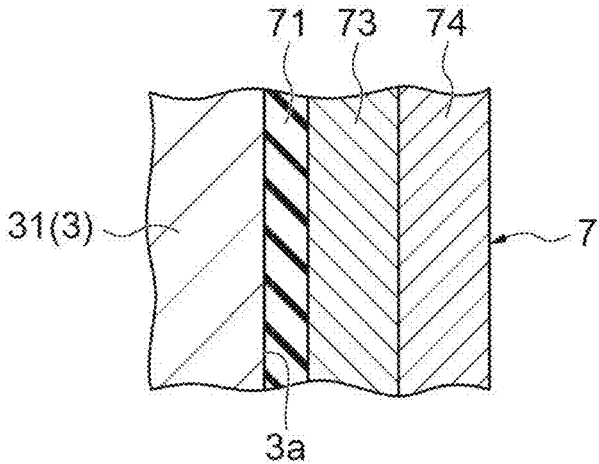
FIG. 8 is an enlarged cross-sectional view of an anti-reflection film of a second modification example.

As one example, as shown in FIG. 8, in the anti-reflection film 7, the first refractive index film 73 may be a $CeF_3$ film formed on the insulating film 71 on the side opposite the first end surface 3a with respect to the insulating film 71, and the second refractive index film 74 may be a ZnS film formed on the first refractive index film 73 on the side opposite the first end surface 3a with respect to the first refractive index film 73 (hereinafter, referred to as the "anti-reflection film 7 of a second modification example"). In the anti-reflection film 7 of the second modification example, the first refractive index film 73 is directly formed on the insulating film 71, and the second refractive index film 74 is directly formed on the first refractive index film 73. According to the anti-reflection film 7 of the second modification example, the configuration of the anti-reflection film 7 can be simplified. FIG. 9 is a table showing one example of numerical values of each film forming the anti-reflection film 7 of the second modification example. In FIG. 9, the "wavelengths" in the "film thickness" column indicate center wavelengths of laser light oscillated by the semiconductor laminate 3, and in the "film thickness" column, the thicknesses of each film that can reduce the reflectance of laser light of each "wavelength" to less than 0.1% are written.

Incidentally, sufficient adhesion between the insulating film 71 that is a $CeO_2$ film and the first refractive index film 73 that is a $CeF_3$ film can be secured. In addition, a mechanical strength of a $CeF_3$ film is smaller than a mechanical strength of a $YF_3$ film, but since the quantum cascade laser element 1 and the support portion 11 are disposed inside a housing, the mechanical strength of the $CeF_3$ film does not matter practically.

In addition, ZnSe, Si, Ge, and the like exist as the material of the second refractive index film 74 having a refractive index of larger than 1.8. However, since ZnSe is toxic, ZnSe is not suitable as a material for the second refractive index film 74.

In addition, in the quantum cascade laser element 1, a metal film may be formed on the second end surface 3b with an insulating film interposed therebetween. Accordingly, the metal film functions as a reflection film, so that an efficient light output from the first end surface is obtained.

Figure 10:
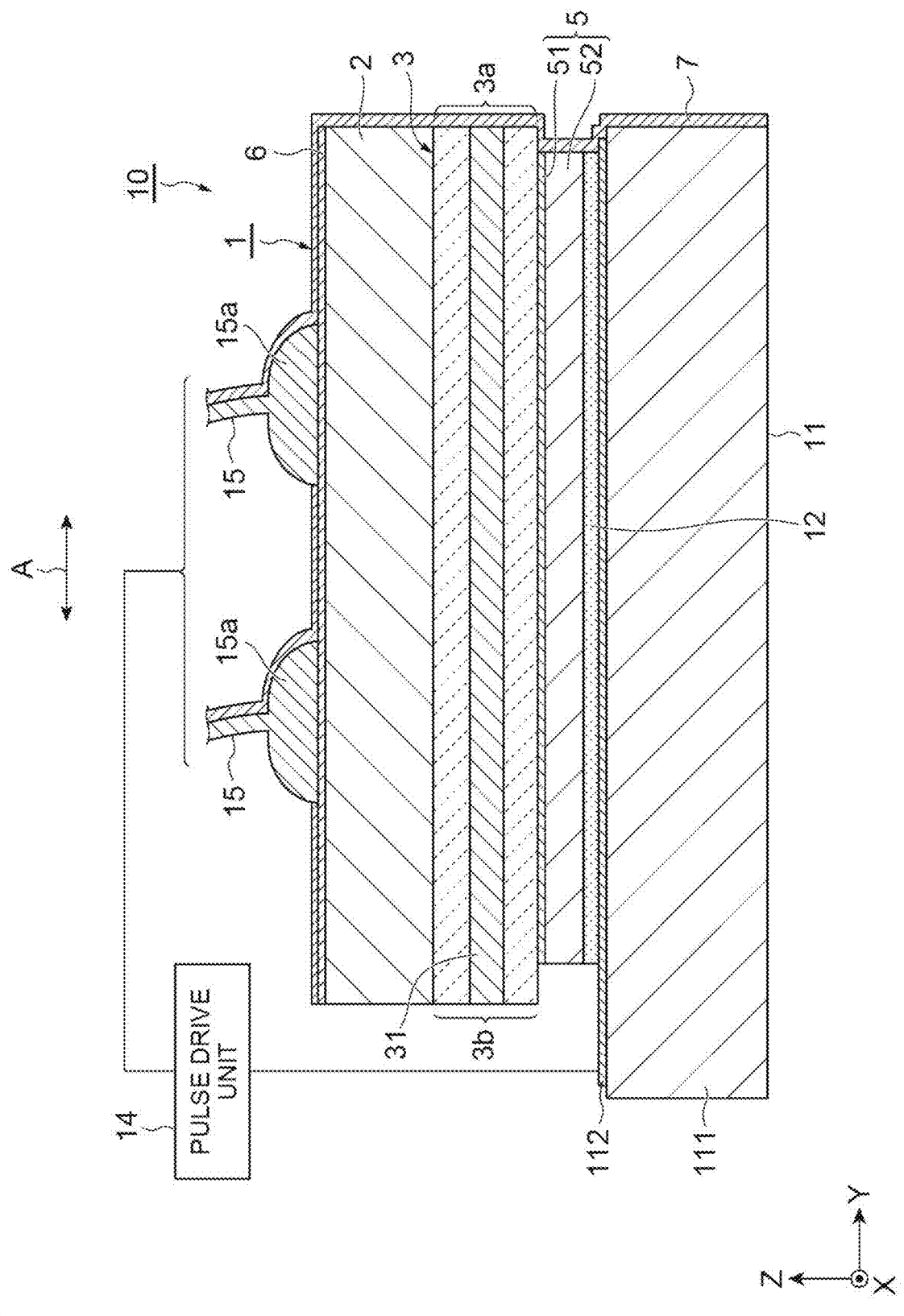
FIG. 10 is a cross-sectional view of a quantum cascade laser device according to a modification example.

In addition, as shown in FIG. 10, in the quantum cascade laser device 10, the quantum cascade laser element 1 may be mounted on the support portion 11 in a state where the semiconductor laminate 3 is located on the support portion 11 side with respect to the semiconductor substrate 2 (namely, an epi-side-down state).

A configuration of the quantum cascade laser device 10 shown in FIG. 10 will be described. As shown in FIG. 10, the quantum cascade laser device 10 includes the quantum cascade laser element 1, the support portion 11, the joining member 12, a plurality of the wires 15, and the pulse drive unit 14.

The support portion 11 includes the body portion 111 and the electrode pad 112. The support portion 11 is, for example, a sub-mount in which the body portion 111 is made of AIN. The support portion 11 supports the quantum cascade laser element 1 in the epi-side-down state.

The joining member 12 joins the electrode pad 112 of the support portion 11 and the first electrode 5 of the quantum cascade laser element 1 in the epi-side-down state. The joining member 12 is, for example, a solder member such as an AuSn member. A thickness of a portion of the joining member 12 disposed between the electrode pad 112 and the first electrode 5 is, for example, approximately several μm.

The plurality of wires 15 are connected to the second electrode 6. Each of the wires 15 is formed by performing wire bonding on the second electrode 6. At least one wire 15 may be connected to the second electrode 6.

The pulse drive unit 14 is electrically connected to the electrode pad 112 and to each of the wires 15. Namely, the pulse drive unit 14 is electrically connected to each of the first electrode 5 and the second electrode 6 of the quantum cascade laser element 1. The pulse drive unit 14 drives the quantum cascade laser element 1 such that the quantum cascade laser element 1 oscillates laser light in a pulsed manner.

A method for manufacturing the quantum cascade laser device 10 shown in FIG. 10 will be described. First, the quantum cascade laser element 1 and the support portion 11 are prepared. Subsequently, in the epi-side-down state, the electrode pad 112 of the support portion 11 and the first electrode 5 of the quantum cascade laser element 1 are joined by the joining member 12, and the plurality of wires 15 are connected to the second electrode 6 of the quantum cascade laser element 1 (first step).

Subsequently, the anti-reflection film 7 is formed on the first end surface 3a of the quantum cascade laser element 1 (second step). At this time, the anti-reflection film 7 is formed to reach both the support portion 11 and each of the wires 15 from the first end surface 3a. Subsequently, as shown in FIG. 10, the pulse drive unit 14 is electrically connected to the electrode pad 112 and to each of the wires 15 to obtain the quantum cascade laser device 10.

As described above, in the quantum cascade laser device 10 shown in FIG. 10, the anti-reflection film 7 is formed to reach both the support portion 11 and each of the wires 15 from the first end surface 3a of the quantum cascade laser element 1. Accordingly, heat generated on the first end surface 3a is easily released to both the support portion 11 and each of the wires 15, for example, as compared to a configuration in which the anti-reflection film 7 reaches neither the support portion 11 nor each of the wires 15. Therefore, according to the quantum cascade laser device 10 shown in FIG. 10, the anti-reflection film 7 that effectively functions for laser light having a center wavelength of 7.5 μm or more can be realized.

In the quantum cascade laser device 10 shown in FIG. 10, the pulse drive unit 14 drives the quantum cascade laser element 1 such that the quantum cascade laser element 1 oscillates laser light in a pulsed manner. Accordingly, laser light having a center wavelength of 7.5 μm or more can be oscillated through the anti-reflection film 7 in a pulsed manner. In addition, heat generation on the first end surface 3a can be suppressed, for example, as compared to a configuration in which the quantum cascade laser element 1 continuously oscillates laser light. Therefore, the degradation of the anti-reflection film 7 caused by heat generation on the first end surface 3a can be suppressed.

In the method for manufacturing the quantum cascade laser device 10 shown in FIG. 10, after the electrode pad 112 of the support portion 11 and the first electrode 5 of the quantum cascade laser element 1 are joined by the joining member 12, the anti-reflection film 7 is formed on the first end surface 3a of the quantum cascade laser element 1. Accordingly, a situation where heating applied when the electrode pad 112 and the first electrode 5 are joined causes the degradation of the anti-reflection film 7 is avoided. Therefore, according to the method for manufacturing the quantum cascade laser device 10 shown in FIG. 10, the anti-reflection film 7 that effectively functions for laser light having a center wavelength of 7.5 μm or more can be realized.

In the method for manufacturing the quantum cascade laser device 10 shown in FIG. 10, the anti-reflection film 7 is formed to reach both the support portion 11 and each of the wires 15 from the first end surface 3a of the quantum cascade laser element 1. Accordingly, the quantum cascade laser device 10 in which heat generated on the first end surface 3a is easily released to both the support portion 11 and each of the wires 15 can be easily and reliably obtained.

Incidentally, in the quantum cascade laser device 10 shown in FIG. 1 and in the quantum cascade laser device 10 shown in FIG. 10, a heat sink (not shown) is provided on the support portion 11 side. For this reason, in a configuration in which the quantum cascade laser element 1 is mounted on the support portion 11 in the epi-side-down state (epi-side-down configuration shown in FIG. 10), heat dissipation of the semiconductor laminate 3 is easily secured as compared to a configuration in which the quantum cascade laser element 1 is mounted on the support portion 11 in the epi-side-up state (epi-side-up configuration shown in FIG. 1). Therefore, when it is examined that the pulse drive unit 14 is replaced with a CW drive unit and the quantum cascade laser element 1 is driven such that the quantum cascade laser element 1 continuously oscillates laser light, the heat resistance of the anti-reflection film needs to be separately examined, but from the viewpoint of heat dissipation of the semiconductor laminate 3, the epi-side-down configuration is effective. However, depending on conditions or the like, in the epi-side-up configuration or in the epi-side-down configuration, the quantum cascade laser element 1 is not limited to being driven to oscillate laser light in a pulsed manner.

In addition, in the quantum cascade laser device 10 shown in FIG. 1 and in the quantum cascade laser device 10 shown in FIG. 10, the anti-reflection film 7 may be formed to reach at least one of the support portion 11 and each of the wires 15 from the first end surface 3a. Namely, in the method for manufacturing the quantum cascade laser device 10, the anti-reflection film 7 may be formed to reach at least one of the support portion 11 and each of the wires 15 from the first end surface 3a. Accordingly, heat generated on the first end surface 3a is easily released to both the support portion 11 and each of the wires 15, for example, as compared to a configuration in which the anti-reflection film 7 reaches neither the support portion 11 nor each of the wires 15.

However, for example, when the amount of heat generated on the first end surface 3a is at a level that does not cause a problem, the anti-reflection film 7 may reach nor the support portion 11 nor the wires 15. Namely, in the method for manufacturing the quantum cascade laser device 10, the anti-reflection film 7 may be formed to reach neither the support portion 11 nor each of the wires 15 from the first end surface 3a.

Various materials and shapes can be applied to each configuration in the above-described embodiment without being limited to the materials and shapes described above. In addition, each configuration in one embodiment or the modification examples described above can be arbitrarily applied to each configuration in another embodiment or modification example.

REFERENCE SIGNS LIST

1: quantum cascade laser element, 2: semiconductor substrate, 2b: surface, 3: semiconductor laminate, 3a: first end surface, 3b: second end surface, 3c: surface, 5: first electrode, 6: second electrode, 7: anti-reflection film, 10: quantum cascade laser device, 11: support portion, 12: joining member, 14: pulse drive unit (drive unit), 15: wire, 31: active layer, 71: insulating film, 72: intermediate film, 73: first refractive index film, 74: second refractive index film, 112: electrode pad, A: light waveguide direction.

The invention claimed is:

1. A quantum cascade laser element comprising:

a semiconductor substrate;

a semiconductor laminate formed on the semiconductor substrate to include an active layer having a quantum cascade structure and to have a first end surface and a second end surface facing each other in a light waveguide direction;

a first electrode formed on a surface on an opposite side of the semiconductor laminate from the semiconductor substrate;

a second electrode formed on a surface on an opposite side of the semiconductor substrate from the semiconductor laminate; and an anti-reflection film formed on the first end surface, wherein the semiconductor laminate is configured to oscillate laser light having a center wavelength of 7.5 μm or more, the anti-reflection film includes an insulating film being a $CeO_2$ film formed on the first end surface, a first refractive index film being a $YF_3$ film or a $CeF_3$ film disposed on a side opposite the first end surface with respect to the insulating film, and a second refractive index film formed on the first refractive index film on a side opposite the first end surface with respect to the first refractive index film and having a refractive index of larger than 1.8, and wherein a thickness of the insulating film is smaller than a thickness of the second refractive index film, wherein a thickness of the insulating film is 150 nm or less.

2. The quantum cascade laser element according to claim 1, wherein the anti-reflection film further includes an intermediate film disposed between the insulating film and the first refractive index film, the intermediate film is a ZnS film formed on the insulating film, the first refractive index film is a $YF_3$ film formed on the intermediate film, and the second refractive index film is a ZnS film.

3. The quantum cascade laser element according to claim 1, wherein the anti-reflection film further includes an intermediate film disposed between the insulating film and the first refractive index film, the intermediate film is a ZnS film formed on the insulating film, the first refractive index film is a $CeF_3$ film formed on the intermediate film, and the second refractive index film is a ZnS film.

4. The quantum cascade laser element according to claim 1, wherein the first refractive index film is a $CeF_3$ film formed on the insulating film, and the second refractive index film is a ZnS film.

5. A quantum cascade laser device comprising:

the quantum cascade laser element according to claim 1;

a support portion supporting the quantum cascade laser element;

a joining member joining an electrode pad included in the support portion and the second electrode in a state where the semiconductor substrate is located on a support portion side with respect to the semiconductor laminate;

a wire connected to the first electrode; and a drive unit electrically connected to each of the electrode pad and the wire, and configured to drive the quantum cascade laser element, wherein the anti-reflection film is formed to reach at least one of the support portion and the wire from the first end surface.

6. The quantum cascade laser device according to claim 5, wherein the drive unit drives the quantum cascade laser element such that the quantum cascade laser element oscillates laser light in a pulsed manner.

7. A method for manufacturing the quantum cascade laser device according to claim 6, the method comprising:

a first step of preparing the quantum cascade laser element and the support portion including the electrode pad, of joining the electrode pad and the second electrode using the joining member in a state where the semiconductor substrate is located on the support portion side with respect to the semiconductor laminate, and of connecting the wire to the first electrode; and a second step of forming the anti-reflection film on the first end surface after the first step.

8. The method for manufacturing the quantum cascade laser device according to claim 7, wherein in the second step, the anti-reflection film is formed to reach at least one of the support portion and the wire from the first end surface.

9. A quantum cascade laser device comprising:

the quantum cascade laser element according to claim 1;

a support portion supporting the quantum cascade laser element;

a joining member joining an electrode pad included in the support portion and the first electrode in a state where the semiconductor laminate is located on a support portion side with respect to the semiconductor substrate;

a wire connected to the second electrode; and a drive unit electrically connected to each of the electrode pad and the wire, and configured to drive the quantum cascade laser element, wherein the anti-reflection film is formed to reach at least one of the support portion and the wire from the first end surface.

10. A method for manufacturing the quantum cascade laser device according to claim 7, the method comprising:

a first step of preparing the quantum cascade laser element and the support portion including the electrode pad, of joining the electrode pad and the first electrode using the joining member in a state where the semiconductor laminate is located on the support portion side with respect to the semiconductor substrate, and of connecting the wire to the second electrode; and a second step of forming the anti-reflection film on the first end surface after the first step.

11. The method for manufacturing the quantum cascade laser device according to claim 10, wherein in the second step, the anti-reflection film is formed to reach at least one of the support portion and the wire from the first end surface.

12. The quantum cascade laser device according to claim 7, wherein the drive unit drives the quantum cascade laser element such that the quantum cascade laser element oscillates laser light in a pulsed manner.

13. A quantum cascade laser element comprising:

a semiconductor substrate;

a semiconductor laminate formed on the semiconductor substrate to include an active layer having a quantum cascade structure and to have a first end surface and a second end surface facing each other in a light waveguide direction;

a first electrode formed on a surface on an opposite side of the semiconductor laminate from the semiconductor substrate;

a second electrode formed on a surface on an opposite side of the semiconductor substrate from the semiconductor laminate; and an anti-reflection film formed on the first end surface, wherein the semiconductor laminate is configured to oscillate laser light having a center wavelength of 7.5 μm or more, the anti-reflection film includes an insulating film being a $CeO_2$ film formed on the first end surface, a first refractive index film being a $YF_3$ film or a $CeF_3$ film disposed on a side opposite the first end surface with respect to the insulating film, and a second refractive index film formed on the first refractive index film on a side opposite the first end surface with respect to the first refractive index film and having a refractive index of larger than 1.8, the anti-reflection film further includes an intermediate film disposed between the insulating film and the first refractive index film, the intermediate film is a ZnS film formed on the insulating film, the first refractive index film is a $YF_3$ film formed on the intermediate film, and the second refractive index film is a ZnS film.

14. A quantum cascade laser element comprising:

a semiconductor substrate;

a semiconductor laminate formed on the semiconductor substrate to include an active layer having a quantum cascade structure and to have a first end surface and a second end surface facing each other in a light waveguide direction;

a first electrode formed on a surface on an opposite side of the semiconductor laminate from the semiconductor substrate;

a second electrode formed on a surface on an opposite side of the semiconductor substrate from the semiconductor laminate; and an anti-reflection film formed on the first end surface, wherein the semiconductor laminate is configured to oscillate laser light having a center wavelength of 7.5 μm or more, the anti-reflection film includes an insulating film being a $CeO_2$ film formed on the first end surface, a first refractive index film being a $YF_3$ film or a $CeF_3$ film disposed on a side opposite the first end surface with respect to the insulating film, and a second refractive index film formed on the first refractive index film on a side opposite the first end surface with respect to the first refractive index film and having a refractive index of larger than 1.8, the anti-reflection film further includes an intermediate film disposed between the insulating film and the first refractive index film, the intermediate film is a ZnS film formed on the insulating film, the first refractive index film is a $CeF_3$ film formed on the intermediate film, and the second refractive index film is a ZnS film.

* * * * *